United States Patent [19]

Lin et al.

[11] Patent Number: 5,583,073
[45] Date of Patent: Dec. 10, 1996

[54] METHOD FOR PRODUCING ELECTROLESS BARRIER LAYER AND SOLDER BUMP ON CHIP

[75] Inventors: Kwang-Lung Lin; Chwan-Ying Lee, both of Tainan, Taiwan

[73] Assignee: National Science Council, Taipei, Taiwan

[21] Appl. No.: 368,847

[22] Filed: Jan. 5, 1995

[51] Int. Cl.$^6$ .................................. H01L 21/28
[52] U.S. Cl. ..................... 439/183; 437/190; 437/230
[58] Field of Search ................................. 437/183, 190, 437/194, 230; 257/737

[56] References Cited

U.S. PATENT DOCUMENTS

| | | | |
|---|---|---|---|
| 4,122,215 | 10/1978 | Vratny | 437/230 |
| 4,162,337 | 7/1979 | D'Asaro et al. | 437/230 |
| 4,372,996 | 2/1983 | Guditz et al. | 437/230 |
| 5,236,873 | 8/1993 | Anceau et al. | 437/230 |

FOREIGN PATENT DOCUMENTS

| | | |
|---|---|---|
| 54-037571 | 3/1979 | Japan . |
| 58-051511 | 3/1983 | Japan . |
| 03050735 | 3/1991 | Japan . |
| 04368129 | 6/1991 | Japan . |
| 03209725 | 9/1991 | Japan . |
| 04044230 | 2/1992 | Japan . |
| 04092432 | 3/1992 | Japan . |

OTHER PUBLICATIONS

M. Inaba, K. Yamakawa, and N. Iwase, "Solder Bump Formation Using Electroless Plating and Ultrasonic Soldering", IEEE Transactions on Components, Hybrids, and Manufacturing Technology, vol. 13, No. 1, 119, Mar. 1990.

K. Wang, K. Chi and A. Rangappan, "Application of Electroless Nickel Plating in the Semiconductor Microcircuit Industry", Plating and Surface Finishing, 70, Jul. 1988.

*Primary Examiner*—George Fourson
*Assistant Examiner*—Thomas G. Bilodeau

[57] ABSTRACT

The present method for producing a barrier layer and a solder bump on a chip includes: a) providing a silicon chip with a bump base; b) forming a metal pad, e.g. an aluminum pad, on the bump base; c) having the metal pad contact with a solution containing about 120~150 g/l NaOH, 20~25 g/l ZnO, 1 g/l NaNO$_3$ and 45~55 g/l C$_4$H$_4$KNaO$_6$·4H$_2$O to form thereon a zinc layer, and preferably further containing tartaric acid for reducing a dissolving rate of the metal pad.; d) having the zinc layer contact with a deposition solution to deposit thereon an electroless barrier layer, e.g. an electroless Ni-P layer; and e) dipping the resulting silicon chip into a molten solder bath to form a solder bump on the electroless barrier layer. The present invention is a simple process for manufacturing an electroless Ni-P and a solder bump on a chip.

18 Claims, 4 Drawing Sheets

METHOD FOR PRODUCING ELECTROLESS BARRIER LAYER AND SOLDER BUMP ON CHIP

FIELD OF THE INVENTION

The present invention is related to a method for producing a barrier layer and a solder bump on a chip.

BACKGROUND OF THE INVENTION

In the electronic industrial field, wire bonding, tape automated bonding (TAB) and flip chip techniques are used for bonding a chip on a circuit board. Among these techniques, flip chip technique will be the most popular in the future because the number of contacts in every chip may achieve 16000 in this technique which is more than that in the other two techniques.

In the flip chip technique, a solder bump on an aluminum pad is utilized to bond a chip on a board. However, the solder bump is difficult to be deposited on the aluminum pad because the surface of the aluminum pad is subject to oxidation and thus an oxide layer is usually formed thereon. In order to overcome this problem, a conventional method uses evaporation deposition or electroplating procedure to produce the solder bump. Before the evaporation deposition or electroplating procedure, several metal layers, e.g. Cr/Cu/Au or Ti/Ni/Au, have to be sputtered on the aluminum pad first. The chromium layer serves as an adhesive layer because of its good adhesion property with the passivation layer, the copper layer functions for moistening, and the gold layer is used to prevent the oxidation of copper and enhance the solderability.

The conventional method has the shortcomings listed below.
1. Both evaporation deposition and electroplating methods have to be executed in vacuum which results in a complicated process;
2. A mask is necessary for preventing the metal from being deposited or plated on the passivation layer; and
3. In the evaporation deposition process, the vapor pressure of lead is higher than that of tin so that lead vaporizes and deposits on the aluminum pad earlier than tin, and thus the component of solder will not be uniform; and
4. The solder bump obtained by the conventional method is flat and difficult to be bonded to the board. Therefore, the chip with the solder bump has to be heated in a reducing atmosphere to have the solder melt and molded to a proper shape for bonding. That will result in a more complicated process.

In addition to the method for depositing a solder bump, The selection of materials for an adhesive layer and/or diffusion barrier layer is important as well. The adhesivity to the aluminum pad, the reaction rate with aluminum or Pb-Sn alloy, and the atomic diffusivity of the adhesive layer and/or diffusion barrier layer should all be taken into account. In general, the grain boundary diffusion of a metal film is more significant than its volume diffusion at a low temperature so that the final device is subject to be rejected owing to the grain boundary diffusion. Therefore, a single crystal or an amorphous material is usually used to construct the diffusion barrier layer to avoid the grain boundary diffusion. As the electroless Ni-P is amorphous, it will not be deposited on the inert material, i.e. the substrate, so that a mask is not needed therefor, and moreover, it has a good adhesiveness to the aluminum pad. Therefore, an electroless Ni-P layer is a good choice for serving as a diffusion barrier layer, as disclosed in Ref. 1.

In 1988, Wong et al disclose a method for producing a barrier layer which is an electroless Ni-P layer and a solder bump which consists of 60% Sn and 40% Pb, as shown in Ref. 2. However, the melting point of the solder bump Wang et al produces is too low (about 188° C.) to be extensively applied to the industry. In the electronic package technique, "chip to substrate" belongs to the first level package and "substrate to card" belongs to the second level package. The higher the package level, the lower should the melting point of the material be to prevent the bonded material from melting again. Therefore, a solder bump having a higher melting point should be chosen for this purpose. In addition, the process disclosed by Wang et al needs "double" zincating procedures to form a zinc layer before forming the electroless Ni-P so that the process is complicated. On the other hand, a flux suitable for the high melting point bump should be carefully selected. Rosin which is a combination of three isomers of diterpene acid, i.e. sylvic acid, d-pimaric acid and l-pimaric acid, is conventionally used as a flux in the electronic industry. The sylvic acid is easy to proceed rearrangement at about 300° C. to form a mixture of n-eoabietic acid and pyroabietic acid which are chemically inert. Therefore, rosin is not suitable for manufacturing a high melting point bump.

REFERENCE

1. M. Inaba, K. Yamakawa, and N. Iwase, "Solder Bump Formation Using Electroless Plating and Ultrasonic Soldering", *IEEE Transactions on Components, Hybrids, and Manufacturing Technology*, Vol. 13, No. 1, 119, March 1990.
2. K. Wang, K. Chi and A. Rangappan, "Application of Electroless Nickel Plating in the Semiconductor Microcircuit Industry", *Plating and Surface Finishing*, 70, July 1988.

SUMMARY OF THE INVENTION

An object of the present invention is to offer a method for producing a barrier layer and a solder bump on a chip by which a solder bump having a high melting point can be manufactured.

Another object of the present invention is to offer a method for producing a barrier layer and a solder bump on a chip which needs zincation only once to simplify the process.

Another object of the present invention is to offer a method for producing a barrier layer and a solder bump on a chip which chooses a flux suitable for manufacturing the high melting point solder bump.

In accordance with the present invention, a method for producing a barrier layer and a solder bump on a chip includes: a) providing a silicon chip with a bump base; b) forming a metal pad, e.g. an aluminum pad, on the bump base; c) having the metal pad contact with a solution containing about 120~150 g/l NaOH, 20~25 g/l ZnO, 1 g/l $NaNO_3$ and 45~55 g/l $C_4H_4KNaO_6 \cdot 4H_2O$ to form thereon a zinc layer, and preferably further containing tartaric acid for reducing a dissolving rate of the metal pad.; d) having the zinc layer contact with a deposition solution to deposit thereon an electroless barrier layer, e.g. an electroless Ni-P layer; and e) dipping the resulting silicon chip into a molten solder bath to form a solder bump on the electroless barrier layer. The method may further include a step b') before the step c) of washing the first metal pad with an alkaline solution, e.g. about 5 wt % NaOH solution, to remove a fat accumulated thereon, and a step b") before the step c) of washing the first metal pad with an acid solution, e.g. about 50 vol % $HNO_3$ solution, to remove an oxide formed thereon.

In accordance with another aspect of the present invention, the deposition solution for depositing the Ni-P layer may include about 30~35 g/l $NiCl_2 \cdot 6H_2O$, 7.5~10 g/l $NaH_2PO_2 \cdot H_2O$, 72~80 g/l $Na_3C_6H_5O_7 \cdot 2H_2O$ and 45~50 g/l $NH_4Cl$, and has a pH value of 9.5~10.5 so that the electroless barrier layer contains 4% phosphorous atoms. It may also include about 16~18 g/l $NaH_2PO_2 \cdot H_2O$, 60~70 $(NH_4)_2SO_4$, 55~65 g/l $Na_3C_6H_5O_7 \cdot 2H_2O$ and 26~30 g/l $NiSO_4 \cdot 6H_2O$, and has a pH value of 8.5~9.5 so that the electroless barrier layer contains 6.5% phosphorous atoms. Also, it may include about 20~30 g/l $NiCl_2 \cdot 6H_2O$, 25~30 g/l $NaH_2PO_2 \cdot H_2O$, and 16 g/l $Na_2C_4H_4O_4 \cdot 7H_2O$, and has a pH value of 4.6~5 so that the electroless barrier layer contains 8.5% phosphorous atoms.

In accordance with another aspect of the present invention, the electroless barrier layer is about 2 μm thick.

In accordance with another aspect of the present invention, the solder bump consists of 95% Pb and 5% Sn.

In accordance with another aspect of the present invention, the method may further include a step d') after the step d) of having the electroless barrier layer contact with a solution containing a gold ion to deposit thereon an electroless gold layer, and the gold layer is preferably about 0.2 μm thick. The solution containing the gold ion includes about 2 g/l $KAu(CN)_2$, 75 g/l $NH_4Cl$, 50 g/l $Na_3C_6H_5O_7 \cdot 2H_2O$ and 10 g/l $NaH_2PO_2 \cdot H_2O$.

In accordance with another aspect of the present invention, the method preferably further includes a step d") before the step e) of dipping the resulting chip into a flux solution for about 5 seconds. The flux solution is obtained by dissolving about 10 g stearic acid and 10 g glutamic acid in 20 ml alcohol.

Therefore, a chip manufactured by the present method includes the silicon chip having thereon a circuit and the bump base; the metal pad depositing on the bump base; the zinc layer obtained by zincation and depositing on the metal pad for enhancing the electroless barrier layer to be deposited thereon; and the solder bump. The chip preferably further includes a gold layer on the solder bump for improving a solderability of the solder bump. A phosphorous atom-percentage of the electroless Ni-P layer is about 4%, 6.5% or 8.5%. The solder bump consists of 95% Pb and 5% Sn.

The present invention may best be understood through the following description with reference to the accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purpose of illustration and description only; it is not intended to be exhaustive or to be limited to the precise form disclosed.

Firstly, a silicon chip with a bump base is provided and an aluminum pad is formed on the bump base. The aluminum pad is washed with an about 5 wt % NaOH solution to remove a fat accumulated thereon, and then washed with an about 50 vol % $HNO_3$ solution to remove an oxide formed thereon. The aluminum pad is caused to contact with a solution containing about 120~150 g/l NaOH, 20~025 g/l ZnO, 1 g/l $NaNO_3$ and 45~55 g/l $C_4H_4KNaO_6 \cdot 4H_2O$ to form thereon a zinc layer, and preferably further containing tartaric acid for reducing a dissolving rate of the aluminum pad. Afterwards, the zinc layer is caused to contact with a deposition solution to deposit thereon an electroless Ni-P layer which serves as a diffusion barrier layer. The deposition solution for depositing the Ni-P layer may include about 30~35 g/l $NiCl_2 \cdot 6H_2O$, 7.5~10 g/l $NaH_2PO_2 \cdot H_2O$, 72~80 g/l $Na_3C_6H_5O_7 \cdot 2H_2O$ and 45~50 g/l $NH_4Cl$, and has a pH value of 9.5~10.5 so that the electroless barrier layer contains 4% phosphorous atoms. It may also include about 16~18 g/l $NaH_2PO_2 \cdot H_2O$, 60~70 $(NH_4)_2SO_4$, 55~65 g/l $Na_3C_6H_5O_7 \cdot 2H_2O$ and 26~30 g/l $NiSO_4 \cdot 6H_2O$, and has a pH value of 8.5~9.5 so that the electroless barrier layer contains 6.5% phosphorous atoms. Also, it may include about 20~30 g/l $NiCl_2 \cdot 6H_2O$, 25~30 g/l $NaH_2PO_2 \cdot H_2O$, and 16 g/l $Na_2C_4H_4O_4 \cdot 7H_2O$, and has a pH value of 4.6~5 so that the electroless barrier layer contains 8.5% phosphorous atoms. The electroless barrier layer is then caused to contact with a solution containing a gold ion to deposit thereon an electroless gold layer, and the gold layer is preferably about 0.2 μm thick. The solution containing the gold ion includes about 2 g/l $KAu(CN)_2$, 75 g/l $NH_4Cl$, 50 g/l $Na_3C_6H_5O_7 \cdot 2H_2O$ and 10 g/l $NaH_2PO_2 \cdot H_2O$. The resulting silicon chip is then dipped into a molten solder bath which consists of 95% Pb and 5% Sn to form a solder bump on the electroless barrier layer, wherein the temperature of the solder furnace is higher than the melting point of the solder by about 40°~80° C. and the deposition rate of the solder is about 12~19 mm/sec. Of course, the chip with the electroless Ni-P layer and the gold layer is preferably dipped into a flux solution for about 5 seconds before it enters the solder furnace. The flux solution is obtained by dissolving about 10g stearic acid and 10 g glutamic acid in 20 ml alcohol. In this example, the electroless barrier layer is about 2 μm thick.

Figure 1:
FIG. 1 is a side view showing a preferred embodiment of a solder bump according to the present invention.

Please refer to FIG. 1 which is a side view showing a preferred embodiment of a solder bump according to the present invention. It is obvious that the solder bump presents a semi-spherical shape without the treatment of reflow soldering. Introducing a protective atmosphere into the solder furnace during the process can avoid an impurity deposited on the surface of the solder bump.

Figure 2:
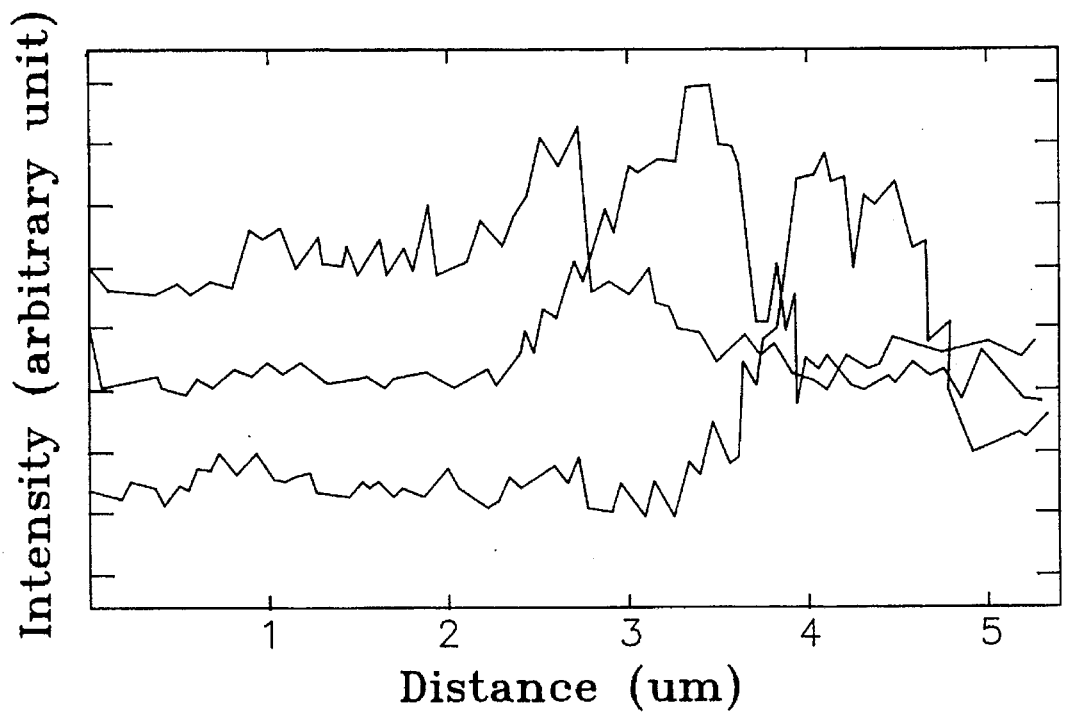
FIG. 2 is an Auger Electron Spectrum showing a cross-section of a preferred embodiment of a solder bump heat-treated at 150° C. for 1000 hours according to the present invention.
Figure 3:
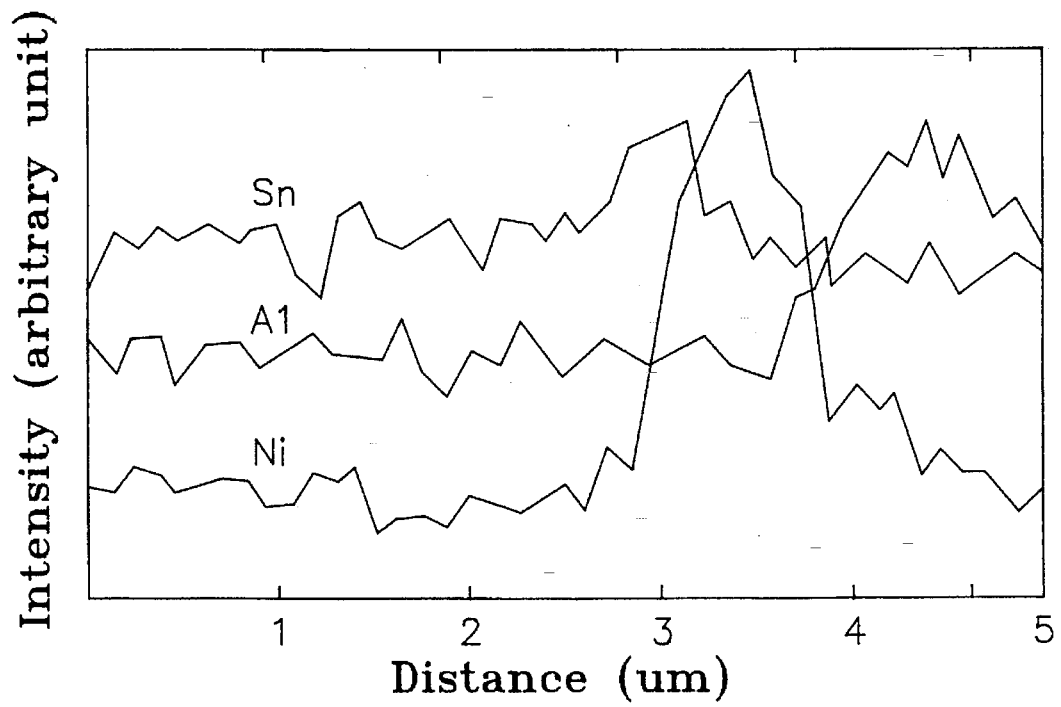
FIG. 3 is an Auger Electron Spectrum showing a cross-section of another preferred embodiment of a solder bump heat-treated at 150° C. for 1000 hours according to the present invention.
Figure 4:
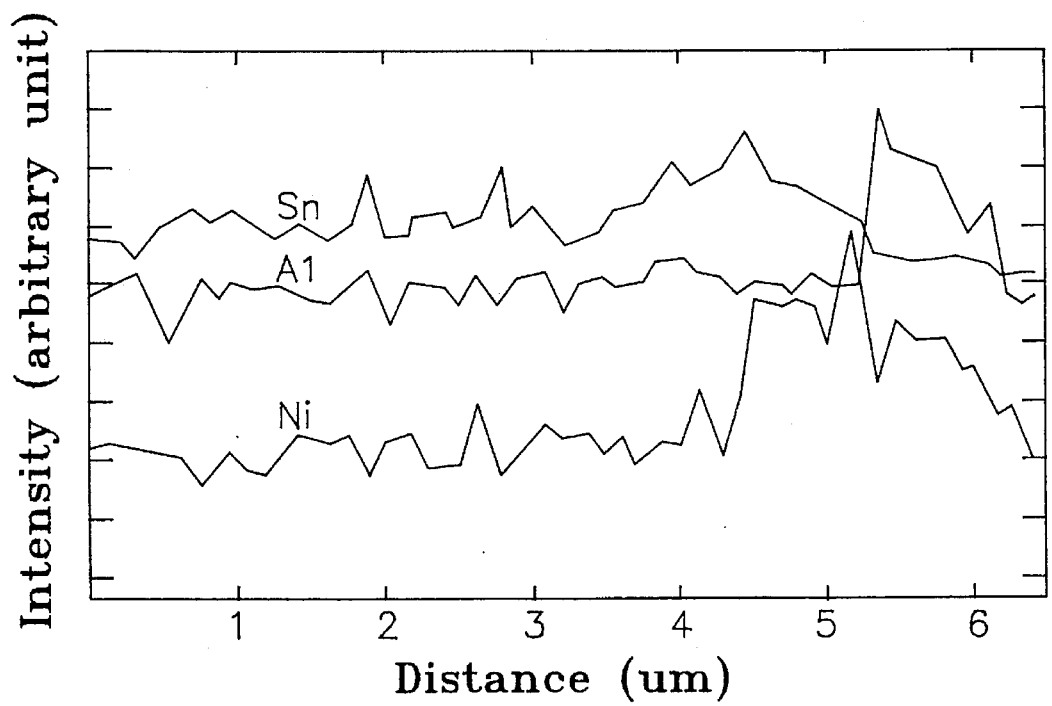
FIG. 4 is an Auger Electron Spectrum showing a cross-section of another preferred embodiment of a solder bump heat-treated at 150° C. for 1000 hours according to the present invention.

Please refer to FIGS. 2, 3 and 4 which are respectively an Auger Electron Spectrum (AES) showing a crosssection of two preferred embodiment of a solder bump heat-treated at 150° C. for 1000 hours according to the present invention. Scanning starts at a location about 5 μm above the interface between the solder bump and the electroless Ni-P layer, goes through the electroless Ni-P layer, the aluminum pad and stops at the silicon chip. In FIG. 2, the phosphorous atom-percentage of the electroless Ni-P layer is 8.5 wt%. It is obvious that the aluminum pad and the solder bump are still isolated by the electroless Ni-P layer even though it has been treated at a temperature of 150° C. for 1000 hours.

In FIG. 3, the phosphorous atom-percentage of the electroless Ni-P layer is 6.5 wt %. Likewise, it is also found that the aluminum pad and the solder bump are still isolated by the electroless Ni-P layer even though it has been treated at a temperature of 150° C. for 1000 hours.

In FIG. 4, the phosphorous atom-percentage of the electroless Ni-P layer is 4 wt %. The AES analysis also shows that the aluminum pad and the solder bump are still isolated by the electroless Ni-P layer.

To sum up, the present invention is a simple process for manufacturing an electroless Ni-P and a solder bump on a chip.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of producing a barrier layer and a solder bump on a chip comprising:
  a) providing a silicon chip with a bump base;
  b) forming a metal pad on said bump base;
  c) having said metal pad contact with a solution containing about 120–150 grams/liter NaOH, 20–25 grams/liter ZnO, 1 grams/liter NaNO$_3$ and 45–55 grams/liter C$_4$H$_4$KNaO$_6$·4H$_2$O to form thereon a zinc layer;
  d) having said zinc layer contact with a deposition solution to deposit thereon an electroless barrier layer; and
  e) dipping said resulting silicon chip into a molten solder bath to form a solder bump on said electroless barrier layer.

2. The method according to claim 1 further comprising a step b') before said step c) of washing said first metal pad with an alkaline solution.

3. The method according to claim 2 wherein said alkaline solution is an about 5 weight % NaOH solution.

4. The method according to claim 1 further comprising a step b") before said step c) of washing said first metal pad with an acid solution to remove an oxide formed thereon.

5. The method according to claim 4 wherein said acid solution is an about 50 volume % HNO$_3$ solution.

6. The method according to claim 1 wherein said metal pad is an Al pad.

7. The method according to claim 1 wherein said electroless barrier layer is an electroless Ni-P layer.

8. The method according to claim 1 wherein said solution in said step c) further comprises tartaric acid for inhibiting said metal pad from dissolving during said metal pad solution contacting step.

9. The method according to claim 7 wherein said deposition solution for depositing said Ni-P layer includes about 30–35 grams/liter NiCl$_2$·6H$_2$O, 7.5–10 grams/liter NaH$_2$PO$_2$·H$_2$O, 72–80 grams/liter Na$_3$C$_6$H$_5$O$_7$·2H$_2$O and 45–50 grams/liter NH$_4$Cl and has a pH value of 9.5–10.5 so that said electroless barrier layer contains 4% phosphorous atoms.

10. The method according to claim 7 wherein said deposition solution for depositing said Ni-P layer includes about 16–18 grams/liter NaH$_2$PO$_2$·H$_2$O, 60–70 (NH$_4$)$_2$SO$_4$, 55–65 grams/liter Na$_3$C$_6$H$_5$O$_7$·2H$_2$O and 26–30 grams/liter NiSO$_4$·6H$_2$O, and has a pH value of 8.5–9.5 so that said electroless barrier layer contains 6.5% phosphorous atoms.

11. The method according to claim 7 wherein said deposition solution for depositing said Ni-P layer includes about 20–30 grams/liter NiCl$_2$·6H$_2$O, 25–30 grams/liter NaH$_2$PO$_2$·H$_2$O, and 16 grams/liter Na$_2$C$_4$H$_4$O$_4$·7H$_2$O, and has a pH value of 4.6–5 so that said electroless barrier layer contains 8.5% phosphorous atoms.

12. The method according to claim 1 wherein said electroless barrier layer is about 2 μm thick.

13. The method according to claim 1 wherein said solder bump consists of Pb and Sn.

14. The method according to claim 1 further comprising a step d') after said step d) of having said electroless barrier layer contact with a solution containing a gold ion to deposit thereon an electroless gold layer.

15. The method according to claim 14 wherein said gold layer is about 0.2 μm thick.

16. The method according to claim 14 wherein said solution containing said gold ion includes about 2 grams/liter KAu(CN)$_2$, 75 grams/liter NH$_4$Cl, 50 grams/liter Na$_3$C$_6$H$_5$O$_7$·2H$_2$O and 10 grams/liter NaH$_{2PO2}$·H$_2$O.

17. The method according to claim 1 further comprising a step d") before said step e) of dipping said resulting chip into a flux solution for about 5 seconds.

18. The method according to claim 1 wherein said flux solution is obtained by dissolving about 10 grams stearic acid and 10 grams glutamic acid in 20 milliliters alcohol.

* * * * *